US009323272B2

(12) United States Patent
Rana et al.

(10) Patent No.: US 9,323,272 B2
(45) Date of Patent: Apr. 26, 2016

(54) INTEGRATED CIRCUIT WITH INTERNAL AND EXTERNAL VOLTAGE REGULATORS

(71) Applicants: Manmohan Rana, Ghaziabad (IN); Rakesh Pandey, Ghaziabad (IN); Nishant Singh Thakur, Indore (IN)

(72) Inventors: Manmohan Rana, Ghaziabad (IN); Rakesh Pandey, Ghaziabad (IN); Nishant Singh Thakur, Indore (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 158 days.

(21) Appl. No.: 14/318,699

(22) Filed: Jun. 30, 2014

(65) Prior Publication Data
US 2015/0378385 A1    Dec. 31, 2015

(51) Int. Cl.
| H03L 7/00 | (2006.01) |
| G05F 3/16 | (2006.01) |
| H03K 3/3562 | (2006.01) |
| H03K 19/00 | (2006.01) |

(52) U.S. Cl.
CPC ............... *G05F 3/16* (2013.01); *H03K 3/3562* (2013.01); *H03K 19/0016* (2013.01)

(58) Field of Classification Search
CPC .......... G05F 3/16; H03K 3/012; H03K 3/038; H03K 3/3568
See application file for complete search history.

(56) References Cited

U.S. PATENT DOCUMENTS

| 4,451,742 | A |   | 5/1984  | Aswell |   |
|-----------|---|---|---------|--------|---|
| 5,428,252 | A |   | 6/1995  | Walker et al. |   |
| 5,886,561 | A |   | 3/1999  | Eitan |   |
| 6,118,188 | A | * | 9/2000  | Youssef | H03K 3/02337 307/43 |
| 6,661,211 | B1 | * | 12/2003 | Law | H02M 1/36 323/268 |
| 6,671,816 | B1 |   | 12/2003 | Woo |   |
| 6,766,222 | B1 |   | 7/2004  | Duley |   |
| 7,015,680 | B2 | * | 3/2006  | Moraveji | G05F 1/565 323/274 |
| 7,212,067 | B2 | * | 5/2007  | Pasternak | G06F 1/305 327/541 |
| 7,279,927 | B2 |   | 10/2007 | Falkowski et al. |   |
| 7,286,005 | B2 |   | 10/2007 | Jiang |   |
| 7,376,847 | B2 |   | 5/2008  | Chen |   |
| 7,535,284 | B2 |   | 5/2009  | Ito |   |
| 7,608,942 | B2 |   | 10/2009 | Chun et al. |   |
| 7,705,575 | B2 | * | 4/2010  | Akyildiz | H02J 9/005 323/274 |
| 7,739,528 | B2 |   | 6/2010  | Zhuang |   |
| 7,770,037 | B2 |   | 8/2010  | Searles |   |
| 7,800,433 | B2 | * | 9/2010  | Yoshikawa | H03K 19/017545 327/530 |
| 7,812,582 | B2 |   | 10/2010 | Chua-Eoan et al. |   |
| 7,973,595 | B2 |   | 7/2011  | Kimura |   |
| 8,010,819 | B2 |   | 8/2011  | Pastorello et al. |   |
| 8,020,017 | B2 |   | 9/2011  | Padhye et al. |   |
| 8,164,378 | B2 | * | 4/2012  | Pietri | G05F 3/205 327/407 |
| 8,279,646 | B1 |   | 10/2012 | Hamstra |   |
| 8,362,757 | B2 |   | 1/2013  | Sessions |   |
| 8,458,503 | B1 |   | 6/2013  | Haj-Yihia |   |
| 8,471,405 | B2 | * | 6/2013  | DiMarco | H02J 9/005 307/64 |
| 8,653,884 | B2 |   | 2/2014  | Miwa et al. |   |
| 2010/0164469 | A1 |   | 7/2010  | Bansal |   |
| 2013/0321071 | A1 | * | 12/2013 | Pietri | H03K 17/22 327/540 |
| 2014/0197883 | A1 | * | 7/2014  | Sinha | G05F 3/205 327/537 |

* cited by examiner

*Primary Examiner* — Ryan Jager
(74) *Attorney, Agent, or Firm* — Charles E. Bergere

(57) ABSTRACT

An integrated circuit that supports both internal and external voltage regulators as well as various modes, such as a low power mode or a test mode, includes voltage regulator selection circuitry and power control circuitry. The regulator selection circuitry selects one of internal and external regulators based on two pin conditions. The power control circuitry controls ON/OFF status of the regulators corresponding to a power mode, including power-on reset, entering a low power mode, and wake-up from a low power mode.

19 Claims, 10 Drawing Sheets

INTEGRATED CIRCUIT WITH INTERNAL AND EXTERNAL VOLTAGE REGULATORS

BACKGROUND OF THE INVENTION

The present invention is directed to integrated circuits, and, more particularly, to an integrated System-on-Chip (SoC) circuit that supports both internal and external regulators.

Core logic circuits and analog circuits on System-on-Chip (SoC) semiconductor devices are powered by voltage regulators that can be embedded in the semiconductor device as an internal voltage regulator or located outside of the device as an external voltage regulator. Different operations of semiconductor devices may require selection between the internal and external voltage regulators.

Product compatibility and cost reduction require both a minimum pin count and low hardware overhead used in the selection of internal and external regulators. Voltage regulation is further complicated by supporting various power modes, such as low power modes, which require turning on and off the internal and external regulators during a power-up sequence and/or power mode transition. For example, a SoC device may require providing a logic signal on a multi-function input/output (IO) pin to turn off the external regulator. In addition, the SoC device may be required to detect a power-up condition of an external regulator and turn on or off one of the internal regulators accordingly. Furthermore, a SoC device may be required to turn on an external voltage regulator when an internal voltage regulator is not powered on to drive the multi-function IO pin. Accordingly, it would be advantageous to be able to control the selection of internal and external voltage regulators and power on/off modes with a minimum of device overhead.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. The invention can be understood by reference to the following description of example embodiments together with the accompanying drawings in which.

DETAILED DESCRIPTION OF PREFERRED EMBODIMENTS

Figure 1:
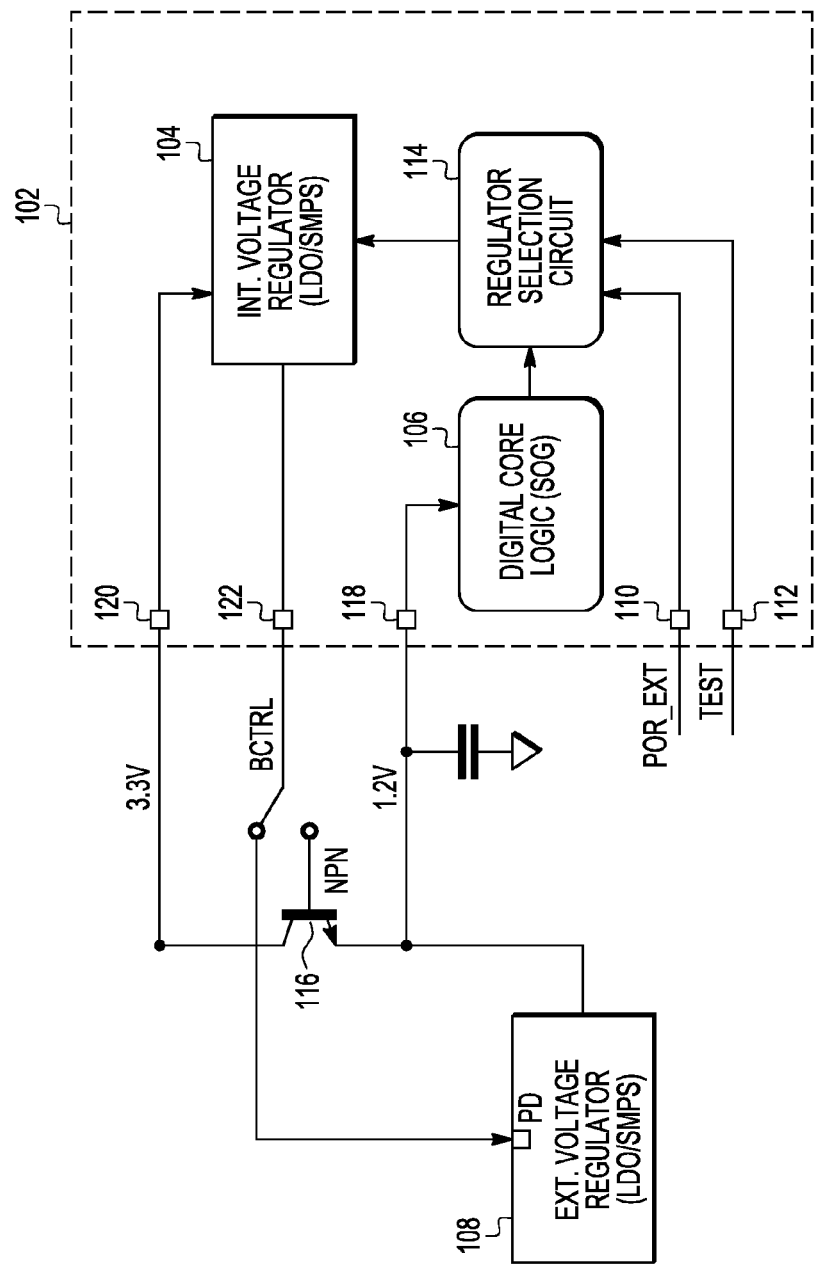
FIG. 1 is a schematic block diagram of an integrated circuit including a core logic circuit powered by internal and external voltage regulators, in accordance with an embodiment of the present invention.

The detailed description set forth below in connection with the appended drawings is intended as a description of presently preferred embodiments of the invention, and is not intended to represent the only forms in which the present invention may be practiced. Because the illustrated embodiments of the present invention may for the most part, be implemented using circuit and device components known to those skilled in the art, details will not be explained in any greater extent than that considered necessary for a complete understanding and appreciation of the underlying concepts of the present invention and in order not to obfuscate or distract from the teachings of the present invention.

In one embodiment, the present invention provides an integrated circuit, including an internal voltage regulator for generating an internal voltage, a digital core logic circuit that receives power from one of the internal voltage regulator and an external voltage regulator located outside of the integrated circuit, a power on reset (POR) pin, a test pin, and a regulator selection circuit that receives an external power on reset (POR_EXT) signal from the POR pin and a TEST signal from the test pin and decodes the POR_EXT signal and the TEST signal to select the one of the internal voltage regulator and the external voltage regulator to supply power to the digital core logic circuit. The external power on reset (POR_EXT) comes from the external regulator, which indicates that a power supply voltage (e.g., 1.2V) generated by the external regulator is stable in an external voltage regulation mode. The integrated circuit is operable in (i) a first functional mode using the power supplied from the internal voltage regulator; (ii) a second functional mode using the power supplied from the external voltage regulator; and (iii) a test mode using power supplied from the external voltage regulator or from a test equipment.

In another embodiment, the present invention provides an integrated circuit, including first and second internal voltage regulators for respectively generating first and second internal voltages. First and second first digital core logic circuit partitions receive power from one of the first and second internal regulators and an external voltage regulator located outside of the integrated circuit. The integrated circuit has a power on reset (POR) pin, a power ON/OFF indicator pin, a power switch, and a regulator selection circuit that receives an external POR signal from the POR pin and provides a power ON/OFF indicator signal to the power ON/OFF indicator pin. The power ON/OFF indicator pin comprises an input/output (IO) pad and is used to turn the external voltage regulator ON and OFF. The integrated circuit is operable in: (i) enabling the first internal voltage regulator and the second internal voltage regulator; (ii) using the power switch to supply power for the first digital core logic circuit partition from the external voltage regulator, wherein the first internal voltage regulator is turned OFF after the external voltage regulator is turned ON; (iii) using a start-low IO pad as the power ON/OFF indicator pin to turn the external voltage regulator ON and OFF, wherein the first internal voltage regulator is kept OFF during a power-up sequence; and (iv) using a BCTRL pad as the power ON/OFF indicator pin to turn the external voltage regulator ON and OFF. In one embodiment, the BCTRL pad is located in one of the first or second digital core logic circuit partitions. The BCTRL pad can be placed in any of the power domains, which are powered by any of the internal or external voltage regulators. During power up the BCTRL pad drives a logic "0" and during low power mode drives a logic "1". The input/output IO pad can be one of a GPIO pad, GPO pad, reset pad, or any digital or analog pad.

In yet another embodiment, the present invention provides a method of operating an integrated circuit having a digital core logic circuit powered by one of an internal voltage regulator and an external voltage regulator located outside of the integrated circuit. The method includes providing a power on reset (POR) signal on a POR pin and a test signal on a test pin, decoding the POR signal and the test signal to generate a voltage regulator selection signal, disabling one of the internal and external voltage regulators based on the voltage regulator selection signal, and enabling the external regulator when the voltage regulator selection signal indicates an external regulator mode.

In another embodiment, a first digital core logic circuit partition (PD0) and a second digital core logic circuit partition (PD1/PD2) are enabled by way of a power switch between PD0 and PD1/PD2 during power up. A low power internal regulator ULPREG is enabled during power up so that a PD input pin of the external regulator is driven to a logic "0". Once a POR_EXT signal is received from the external regulator, the power switch between PD0 and PD1/PD2 is closed, which shuts down the internal regulator ULPREG. In another embodiment, during a low power mode entry, ULPREG is enabled, the power switch is opened, and the external regulator is turned off. In yet another embodiment, when operating an integrated circuit during a low power exit (wake-up), the external regulator is turned on and when the POR_EXT signal goes high, the power switch is turned off and then the internal regulator ULPREG is turned off.

Referring now to FIG. 1, a schematic block diagram of a system 100 including an integrated circuit (IC) 102 in accordance with an embodiment of the present invention is shown. The IC 102 may be a system on a chip (SOC) that includes various partitions, including both analog and digital circuitry. The IC 102 includes an internal voltage regulator 104 for generating an internal voltage, and a digital core logic circuit 106 that receives power from one of the internal voltage regulator 104 and an external voltage regulator 108 located outside of the IC 102. The digital core logic circuit 106 may comprise a variety of different circuits such as a processor circuit, a sea of gates, a power management and reset controller as well as many other IP's, as will be understood by those of skill in the art. The IC 102 also has a power on reset (POR) pin 110 connected to the external voltage regulator 108 for indicating a completion of a POR sequence of the external regulator 108, and a TEST pin 112 used to put the IC 102 into a test mode.

The IC 102 further includes a regulator selection circuit 114 that receives an external power on reset (POR_EXT) signal from the POR pin 110 and a TEST signal from the TEST pin 112. The regulator selection circuit 114 decodes the POR_EXT signal and the TEST signal to select one of the internal voltage regulator 104 and the external voltage regulator 108 in one of three different modes: a first functional mode in which the IC 102 uses the power supplied from the internal voltage regulator 104 while the external voltage regulator 108 is turned off, a second functional mode in which the IC 102 uses the power supplied from the external voltage regulator 108 while the internal voltage regulator 104 is turned off, and a test mode in which the IC 102 uses power supplied from either the external voltage regulator 108 or from a tester (not shown) such as an automated test equipment (ATE). Conventional practice of selection between internal and external voltage regulators requires extra pins and external logic devices that increase overall complexity and system level cost. It will be appreciated that with the present invention, a minimum number of pins need to be decoded to select a power source (i.e., either the internal voltage regulator 104 or the external voltage regulator 108.

In one embodiment, an external ballast (e.g. a bipolar or MOS transistor) 116 is connected between the external voltage regulator 108 and the digital core logic circuit 106 by way of a control pad 122 and a power pad 118 both located on the IC 102, and between the external voltage regulator 108 and the internal voltage regulator 104 by way of a power pad 120 and the control pad 122. The external ballast 116 is a power driver device that provides a core supply when the integrated circuit 102 is used with an internal regulator. A pad 118 receives an input power supply from a first terminal of the ballast 116 and delivers the power supply to the digital core logic circuit 106, while the pad 120 receives a power supply from the internal voltage regulator 104 and delivers the power supply to a second terminal of the ballast 116. The control pad 122 receives a control signal from the internal voltage regulator 104, which is used to control a third terminal of the ballast 116 in internal regulation mode or to control the external regulator 108 in external regulation mode. When external regulation is used the ballast 116 is not needed. The external voltage regulator 108 is also connected to the internal voltage regulator 104 by way of the control pad 122. When in external regulation mode, the control pad 122 is used as power down to the external regulator 108.

Figure 2:
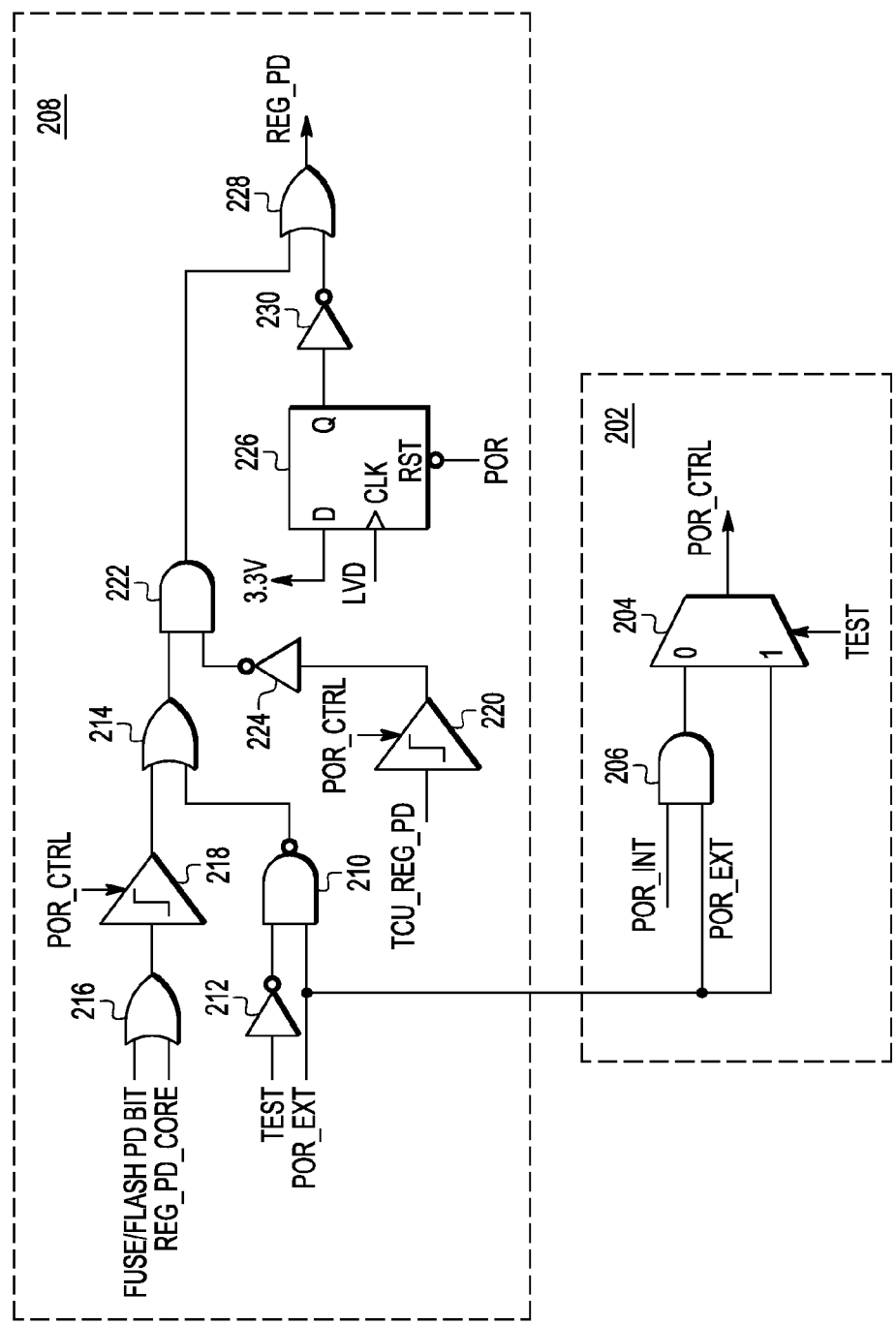
FIG. 2 is a schematic block diagram of a first embodiment of a regulator selection circuit of the integrated circuit of FIG. 1.
Figure 4:
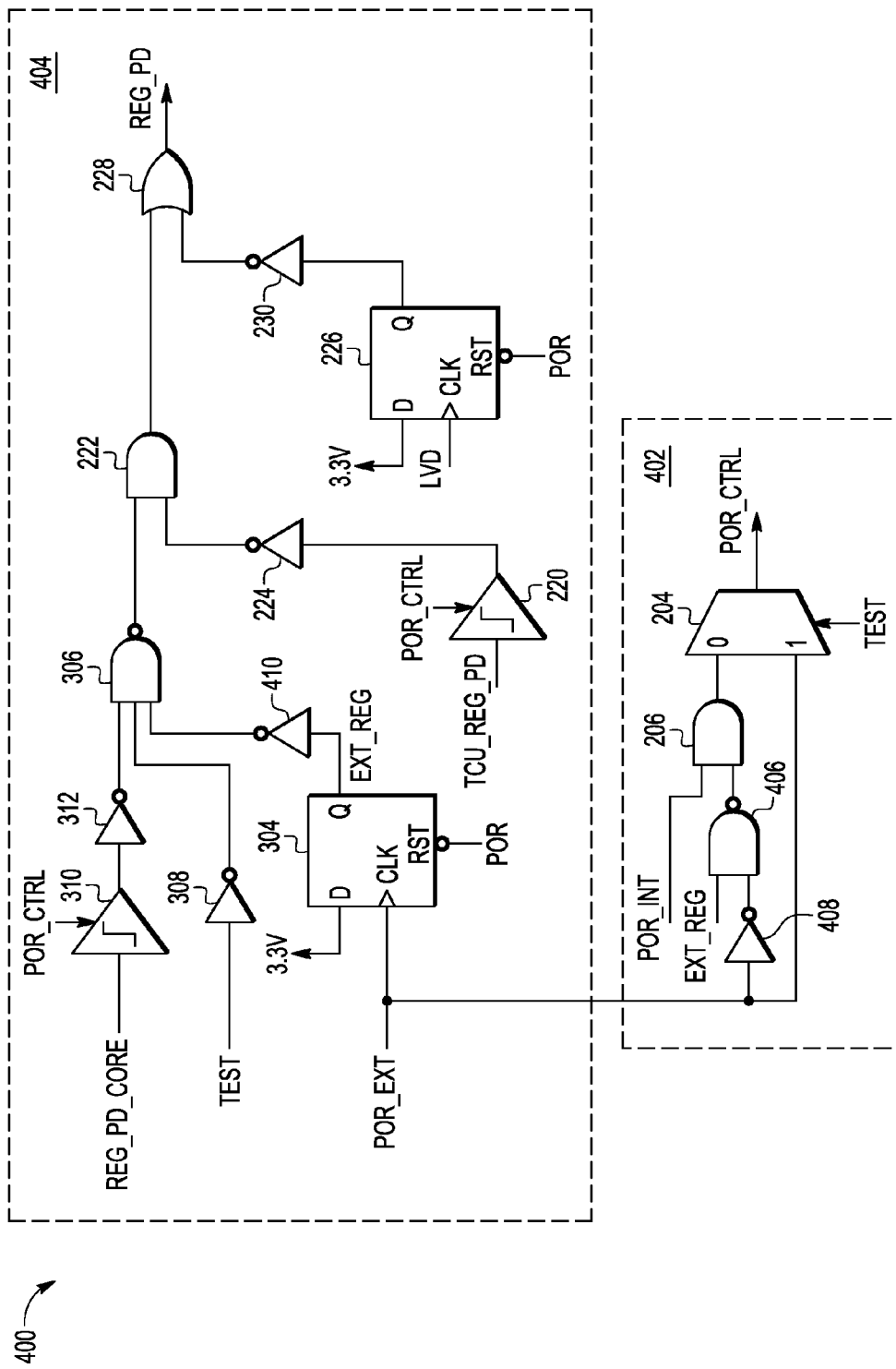
FIG. 4 is a schematic block diagram of a third embodiment of the regulator selection circuit of the integrated circuit of FIG. 1.
Figure 6:
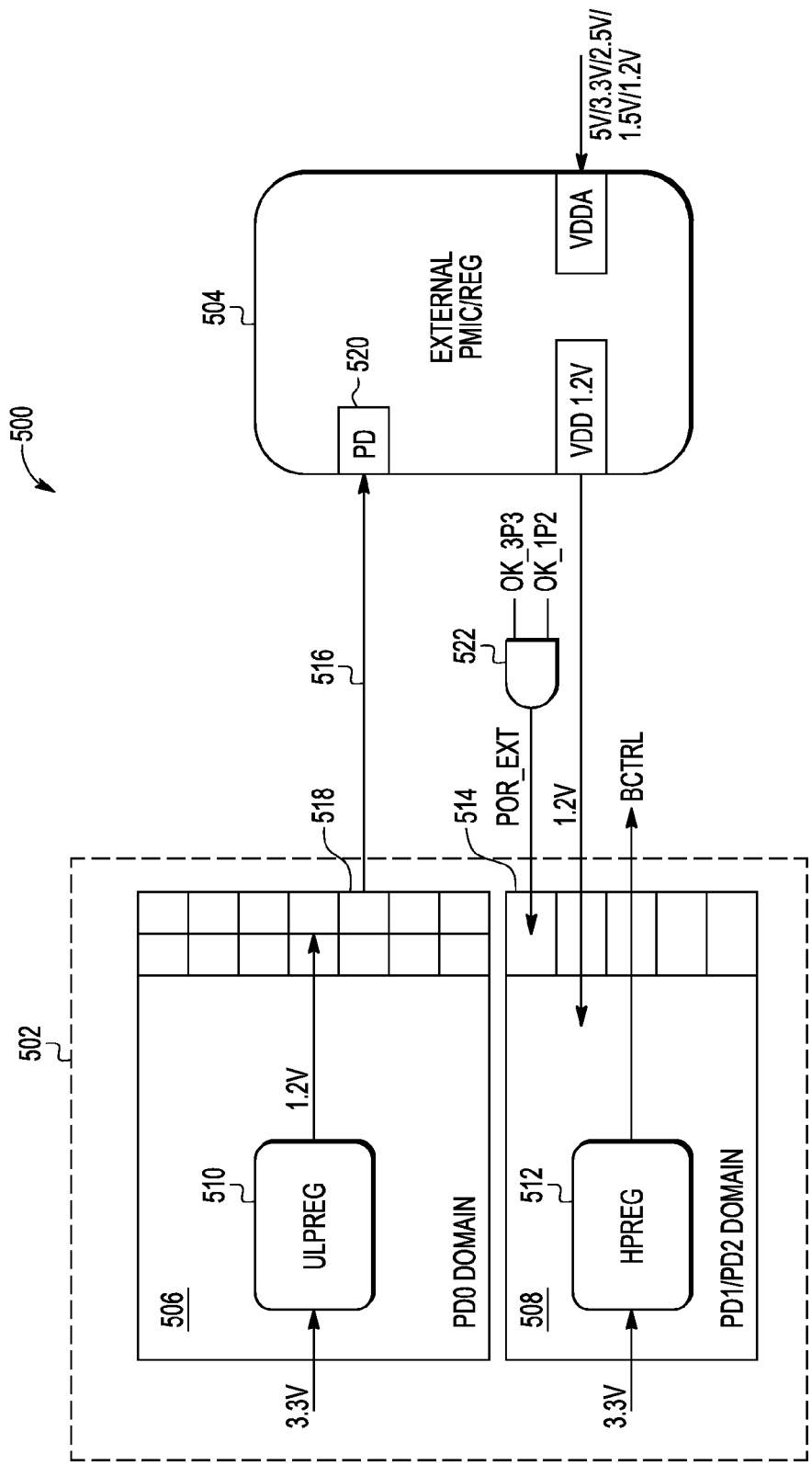
FIG. 6 is a schematic block diagram of a low power integrated circuit that supports internal and external voltage regulators in accordance with an embodiment of the present invention.

FIGS. 2, 4 and 6 show three alternative embodiments of the regulator selection circuit 114 of the IC 102.

Referring to FIG. 2, a regulator selection circuit 200 according to a first embodiment is shown. The regulator selection circuit 200 receives as inputs an internal power on reset (POR_INT) signal, the POR_EXT signal and the TEST signal and generates a REG_PD signal and a power on reset control (POR_CTRL) signal. The REG_PD signal and the POR_CTRL signal are used to select the one of the internal voltage regulator 104 and the external voltage regulator 108 to be used in one of the three different modes described above (first and second functional modes and test mode).

The regulator selection circuit 200 includes a multiplexer or mux 202 that includes a first selector 204 and a first AND gate 206. The first selector 204 has a first input connected to an output of the first AND gate 206, a second input that receives the POR_EXT signal, a control or address input that receives the TEST signal, and an output that provides a power on reset control (POR_CTRL) signal. The first AND gate 206 has two inputs that receive an internal power on reset (POR_INT) signal and the POR_EXT signal, respectively. The internal power on reset (POR_INT) comes from one of the internal regulator and an internal Power Management Controller (PMC), which indicates that a power supply voltage (e.g., 1.2V) generated by the internal regulator is stable in an internal voltage regulation mode. The mux 202 selects a logic AND result of the POR_INT signal and the POR_EXT signal when the TEST signal is low, or selects the POR_EXT signal when the TEST signal is high, as the POR_CTRL signal.

The regulator selection circuit 200 also includes a decoder 208 for generating a REG_PD signal that is used to select between the internal voltage regulator, the external voltage regulator, or a test mode, as described above, based on the POR_EXT signal received from the POR_EXT pin, the TEST signal received from the TEST pin, and the REG_CTRL signal output by the mux 202.

The decoder 208 has a two-input NAND gate 210 that receives the test signal by way of an inverter 212 (so actually receives/test), and the POR_EXT signal. An output of the NAND gate 210 is input to a first OR gate 214. The OR gate 214 also receives an output of a second OR gate 216. The OR gate 216 receives as inputs a PD bit, which may be generated by a fuse circuit or stored in a memory such as a bit in a flash memory, and a REG_PD_CORE signal. The PD (power down) bit comprises a fuse register bit or a flash memory bit that can be loaded at SoC system boot time so that the power down function can be asserted automatically. The REG_PD_CORE signal is a functional power down (PD) signal generated by a state machine inside the IC 102 and is used to power down the internal regulator 104 for a low power mode. The REG_PD_CORE signal can be controlled by software by writing a value into an internal register.

The decoder 208 may span two different power domains of the IC 102, such as a low power domain that operates at 1.2V, for example, and a higher power domain that operates at 3.3V, for example. Thus, prior to being input to the first OR gate 214, the output of the second OR gate 216 may be level shifted by a level shifter 218. More particularly, the output of the second OR gate 216 is input to the level shifter 218. The level shifter 218 converts the input signal from the lower voltage power domain to the higher voltage power domain. The level shifter 218 also receives the POR_CTRL signal output by the mux 204. The level shifter 218 is reset to a logic low state ("0") at the input and the output by the POR_CTRL signal after a power on reset event.

The decoder 208 also has a second level shifter 220 that receives as an input a TCU_REG_PD signal that comes from a Test Control Unit (TCU) inside the IC 102 that controls an internal Power Management Controller's (PMC) enable/disable in test mode. Thus, TCU_REG_PD is a digital signal running on a low voltage supply (e.g., 1.2V). A two-input AND gate 222 receives the output of the OR gate 214, and the output of the second level shifter 220 by way of an inverter 224.

The decoder 208 also includes a first latch circuit 226. The first latch circuit 226 has a data input tied to a first power supply voltage (e.g. 3.3V), a clock input that receives a low voltage detection signal (LVD) of the first power supply voltage, and a reset input that receives a power on indicator signal (POR). In one embodiment, the LVD and POR signals are generated by a circuit inside the PMC that detects voltage levels of 3.3V supply voltage. POR is a first indicator for a first voltage level V1 and LVD is second indicator for a second voltage level V2, where V2 is higher than V1. With the reset input (RST) of the first latch 226 receiving the power on indicator signal, the first latch 226 is in functional mode when the supply voltage is higher than V1 and is in reset mode if that voltage is below V1. The first latch 226 provides a logic low state ("0") at its output Q during power on reset when the first power supply voltage 3.3V, the low voltage detection signal (LVD) and the POR signal are all stabilized at design target values. For example, the LVD signal is a low voltage detection signal that has a first threshold value. When a high voltage supply (3.3V) rises above this first threshold value, the LVD signal goes high, otherwise it is asserted low. The POR signal is a power on indicator signal that also monitors the high voltage supply (3.3V). When the high voltage supply rises above a second threshold value, the POR signal goes high, otherwise it is asserted low. In one embodiment, the second threshold value of the voltage level monitoring for the POR signal is lower than the first threshold value of the voltage level monitoring for the LVD signal. An example can be where the second threshold value of POR assertion level is 2.0V and the first threshold value for LVD assertion level is 2.6V.

The decoder 208 further includes a second two-input OR gate 228 that receives as inputs the output of the two-input AND gate 222, and the Q output of the latch circuit 226 by way of an inverter 230. The two-input OR gate 228 then outputs the REG_PD signal that is used, along with the POR_CTRL signal, to select the one of the internal voltage regulator 104 and the external voltage regulator 108 to be used in one of the three different modes described above (first and second functional modes and test mode).

An example of the operation of the regulator selection circuit 200 will now be provided with reference to TABLE 1, which is a truth table illustrating the operation of the decoder 208. The truth table shows three modes, a first functional mode using the internal regulator 104, a second functional mode using the external regulator 108, and a test mode. The truth table also shows the TEST pin 112 that receives the TEST signal, and the POR_EXT signal that is received on the POR pin 110. The regulator selection circuit 200 receives the POR_INT signal, the TEST signal and the POR_EXT signal and generates the REG_PD (internal regulator power down) signal. A first power up sequence is controlled by the POR_INT signal, which causes the IC 102 to enter the first functional mode in which the internal voltage regulator 104 is used, where the POR_EXT signal is high (logic "1"). In one embodiment, the POR pin 110 is tied to a 3.3V high voltage supply for using the internal regulator 104. A second power up sequence is controlled by the POR_INT signal and the POR_EXT signal, which cause the IC 102 to enter the second functional mode in which both the internal voltage regulator 104 and the external voltage regulator 108 are on when the POR_EXT signal transitions from a logic low state to a logic high state. After the second power up sequence completes, both the internal voltage regulator 104 and the external regulator 108 are ON. However, the internal voltage regulator 104 can be turned off by the fuse bit or the flash memory bit or via software. The fuse or flash memory bit can be stored in a fuse or flash memory that can be programmed by a user depending on whether the user wants to use either the internal regulator 104 or the external regulator 108. A third power up sequence is controlled by the POR_EXT signal and the TEST signal, and cause the IC 102 to enter a test mode after the POR_EXT signal transitions from a logic low state to a logic high state.

TABLE 1

| MODE | TEST pin | POR_EXT | REG_PD | Internal regulator | POR_CTRL |
|---|---|---|---|---|---|
| Functional with internal regulator | 0 | 1 (tied to supply) | 0 | ON | =POR_INT |
| Functional with external regulator | 0 | 0 -> 1 | 1 | OFF | =POR_INT AND POR_EXT |
| TEST | 1 | 0 -> 1 | 1 | OFF | POR_EXT |

Figure 3:
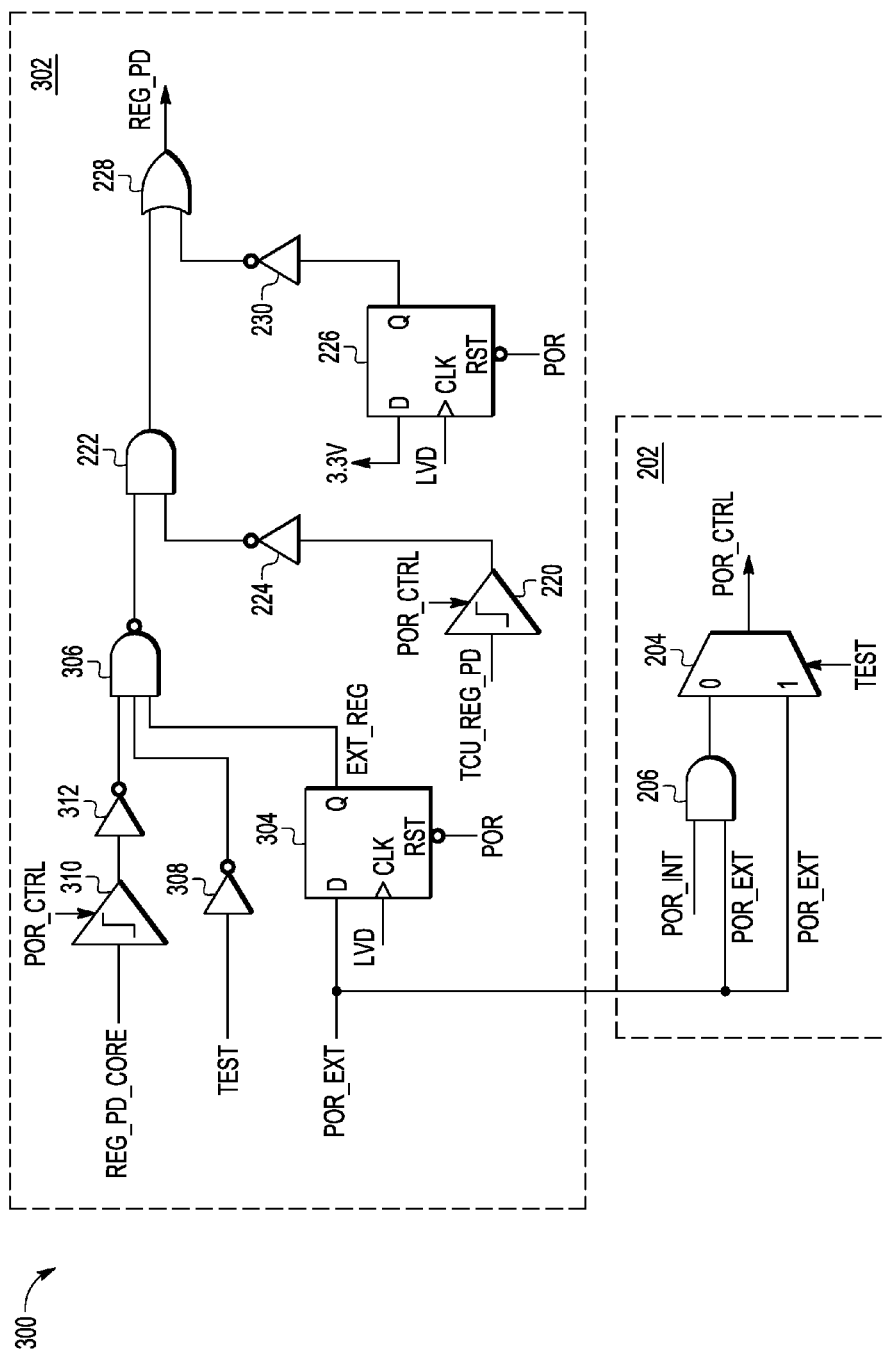
FIG. 3 is a schematic block diagram of a second embodiment of the regulator selection circuit of the integrated circuit of FIG. 1.

FIG. 3 is a schematic block diagram of a second embodiment of a regulator selection circuit 300. The regulator selection circuit 300 includes the mux circuit 202 (FIG. 2) and a decoder circuit 302. The decoder circuit 302 is similar to the decoder circuit 208 (FIG. 2) in that it includes the first level shifter 220, the AND gate 222, the inverter 224, the first latch 226, the OR gate 228, and the inverter 230, but differs in that it includes a second latch 304 and a three-input NAND gate 306. The second latch 304 receives the POR_EXT signal at its data input, the LVD signal at its clock input, and the POR signal at its reset input. The second latch 304 generates an EXT_REG signal at its Q output that is input to the three-input NAND gate 306. The NAND gate 306 also receives the TEST signal by way of an inverter 308 (so actually /TEST is input to the NAND gate 306. The NAND gate 306 also receives a REG_PD_CORE signal by way of a level shifter 310 and an inverter 312. As discussed with reference to FIG. 2, the REG_PD_CORE signal is a functional power down signal generated by a state machine inside the IC 102.

Like the decoder 208, the decoder 302 generates the REG_PD signal. The REG_PD signal or regulator power down signal is a signal for turning on and off the internal regulator 104. In an internal regulation mode, REG_PD=0, while in an external mode, REG_PD=1. The REG_PD signal is activated when either of the REG_PD_CORE or the TEST input signals are high. The embodiment shown in FIG. 3 does not need to use a Fuse/Flash bit to differentiate between internal and external regulation modes.

The regulator selection circuit 300 operates in accordance with the truth table shown above in TABLE 1. That is, the regulator selection circuit 300 functions similar to the regulator selection circuit 200 (FIG. 2) except internal regulator 104 will be off when external regulator 108 is on (when POR_EXT goes high) to save power on the internal regulator. The embodiment shown in FIG. 2 of the regulator selection circuit 200 requires a Fuse/Flash bit (or through software control) to turn off the internal regulator. The embodiment shown in FIG. 3 does not need to use a Fuse/Flash bit (or software) to turn off the internal regulator.

FIG. 4 is a schematic block diagram of a third embodiment of a regulator selection circuit 400. The regulator selection circuit 400 includes a mux circuit 402 and a decoder circuit 404. The mux circuit 402 is similar to the mux circuit 202 and includes the selector 204 that outputs the POR_CTRL signal and the two-input AND gate 206 that has an output that is input to the selector 204. The two-input AND gate 206 has a first input that receives the POR_INT signal and a second input that is connected to the output of a two-input NAND gate 406. The NAND gate 406 has a first input that receives the EXT_REG signal generated by the second latch 304 and a second input that receives the POR_EXT signal by way of an inverter 408 (so it actually receives /POR_EXT).

The decoder circuit 404 is similar to the decoder circuit 302 (FIG. 3) except for the connections (inputs/output) of the second latch 304. In this embodiment, the second latch 304 has its data input (D) tied high (e.g., to a 3.3V supply), its clock input receives the POR_EXT signal, its reset input receives the POR signal, and its output (Q) is input to the NAND gate 306 by way of an inverter 410. The second latch 304 in this embodiment is a master slave flip-flop in which the master reset=1 and the slave reset=0 (the slave stage is reset to a logic low state and the master stage is reset to a logic high state).

Like the decoder circuit 302, the decoder circuit 404 generates the REG_PD signal. The REG_PD signal or regulator power down signal is used to turn on and off the internal regulator 104 (see Table 1). In an internal regulation mode, REG_PD=0, while in an external mode, REG_PD=1. That is, the regulator selection circuit 400 operates in accordance with the truth table shown above in TABLE 1. More specifically, for the regulator selection circuit 400, the REG_PD signal is activated when TCU_REG_PD is low ("0") and one of the REG_PD_CORE, TEST and output Q (EXT_REG) from the latch 304 signals is high ("1"). The latch 226 provides a logic low state ("0") at its output Q during power on reset when the first power supply voltage 3.3V, the low voltage detection signal (LVD) and the power on indicator signal (POR) are all stabilized at design target values. For example, the LVD signal is a low voltage detection signal that has a first threshold value. When a high voltage supply (3.3V) rises above this first threshold value, the LVD signal goes high, otherwise it is asserted low. The POR signal is a power on indicator signal that also monitors the high voltage supply (3.3V). When the high voltage supply rises above a second threshold value, the POR signal goes high, otherwise it is asserted low. The operation of the regulator selection circuit 400 is similar to the operation of the regulator selection circuit 300 (FIG. 3) in that it turns OFF the internal voltage regulator 104 after the POR_EXT signal transitions from low to high, but differs in that turning OFF the internal voltage regulator 104 does not depend on the power up sequence of a 1.2V supply vs. a 3.3V supply. Thus, the internal voltage regulator 104 automatically turns OFF when the POR_EXT signal goes high.

Figure 5:
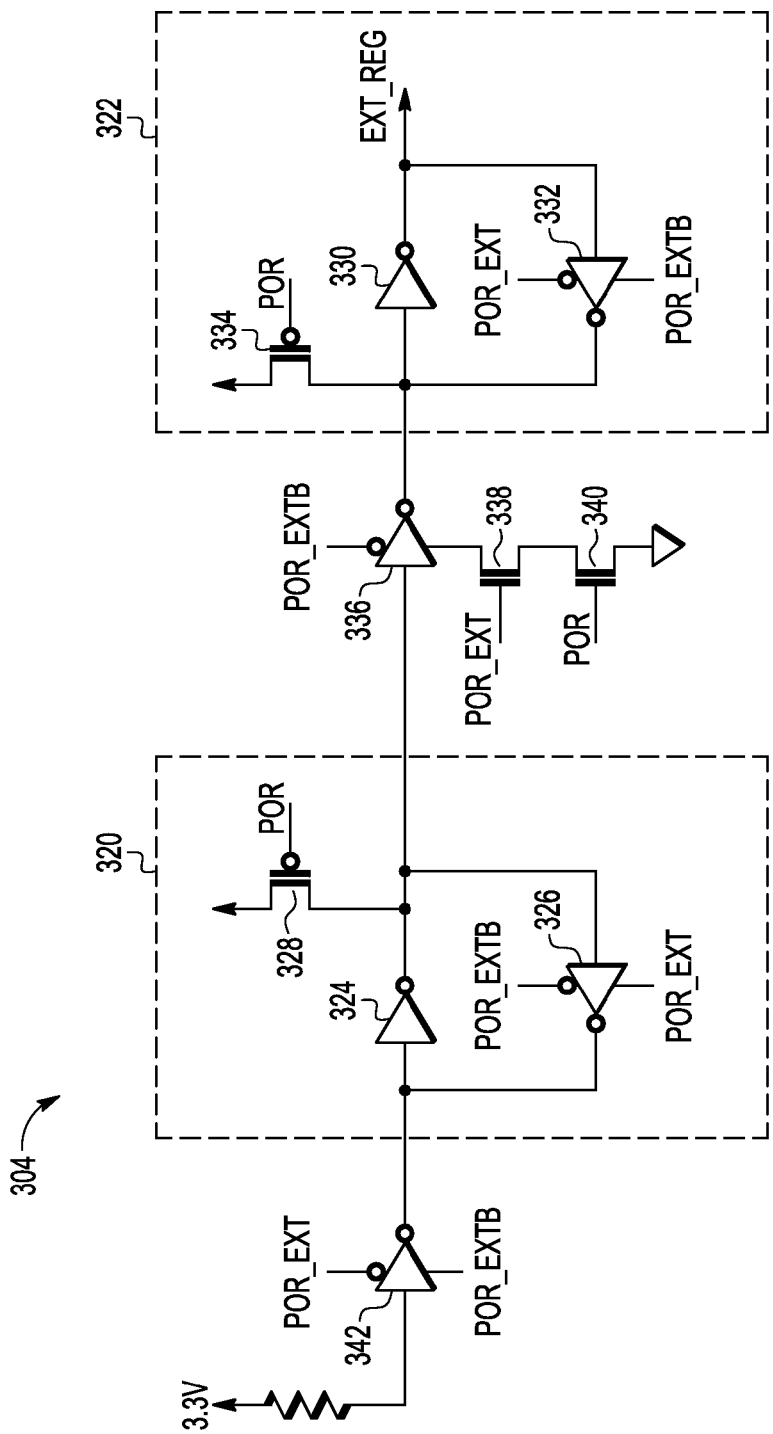
FIG. 5 is a schematic block diagram of an embodiment of a latch cell used in the regulator selection logic of FIG. 4.

Referring now to FIG. 5, a schematic circuit diagram of the second latch 304 (FIGS. 3 and 4) is shown. As discussed above, the second latch 304 is a master-slave flip-flop having a master stage 320 and a slave stage 322 that is reset to a logic state opposite that of the master stage 320. The master stage 320 comprises a first inverter 324 and a first tri-state inverter 326 having an input connected the output of the first inverter 324 and an output connected to an input of the first inverter 324. The master stage 320 also has a first transistor 328 having a drain connected to the output of the first inverter 324, a source connected to a power supply, and a gate that receives the POR signal. The slave stage 322 comprises a second inverter 330 and a second tri-state inverter 332 having an input connected the output of the second inverter 330 and an output connected to an input of the second inverter 330. The slave stage 322 also has a second transistor 334 having a drain connected to the input of the second inverter 330, a source connected to a power supply, and a gate that receives the POR signal. The master stage 320 is connected to the slave stage 322 by way of a third tri-state inverter 336—more specifically, an output of the first inverter 324 is connected to an input of the third tri-state inverter 336 and an output of the third tri-state inverter 336 is connected to an input of the second inverter 330. A third transistor 338 and a fourth transistor 340 are connected in series between a positive control input of the third tri-state inverter 336 and ground; the gates of the third and fourth transistors 338, 340 receive the POR_EXT and POR signals, respectively.

The reset input of the second latch 304 is controlled by the POR signal. The output Q is initially reset to a logic low state while the master stage 320 is initially reset to a logic high state when the POR signal is low. When the POR signal goes high, the output Q goes to a logic high state when the POR_EXT signal transitions from low to high. Then, once the POR signal is asserted (high), the Q output value depends on the POR_EXT signal. In the internal regulator mode (when the internal regulator 104 is ON), the POR_EXT signal is kept low, which keeps the existing latched state in the slave stage 322 driving the Q output, EXT_REG, low. Thus, the EXT_REG signal being low indicates internal regulator mode. In external regulator mode (when the external regulator 108 is ON), the POR_EXT signal will go from low to high.

Low power operation of the integrated circuit 102 described above also requires an architecture to turn the internal and external regulators ON and OFF during a power up sequence and/or in a power mode transition.

Figure 9:
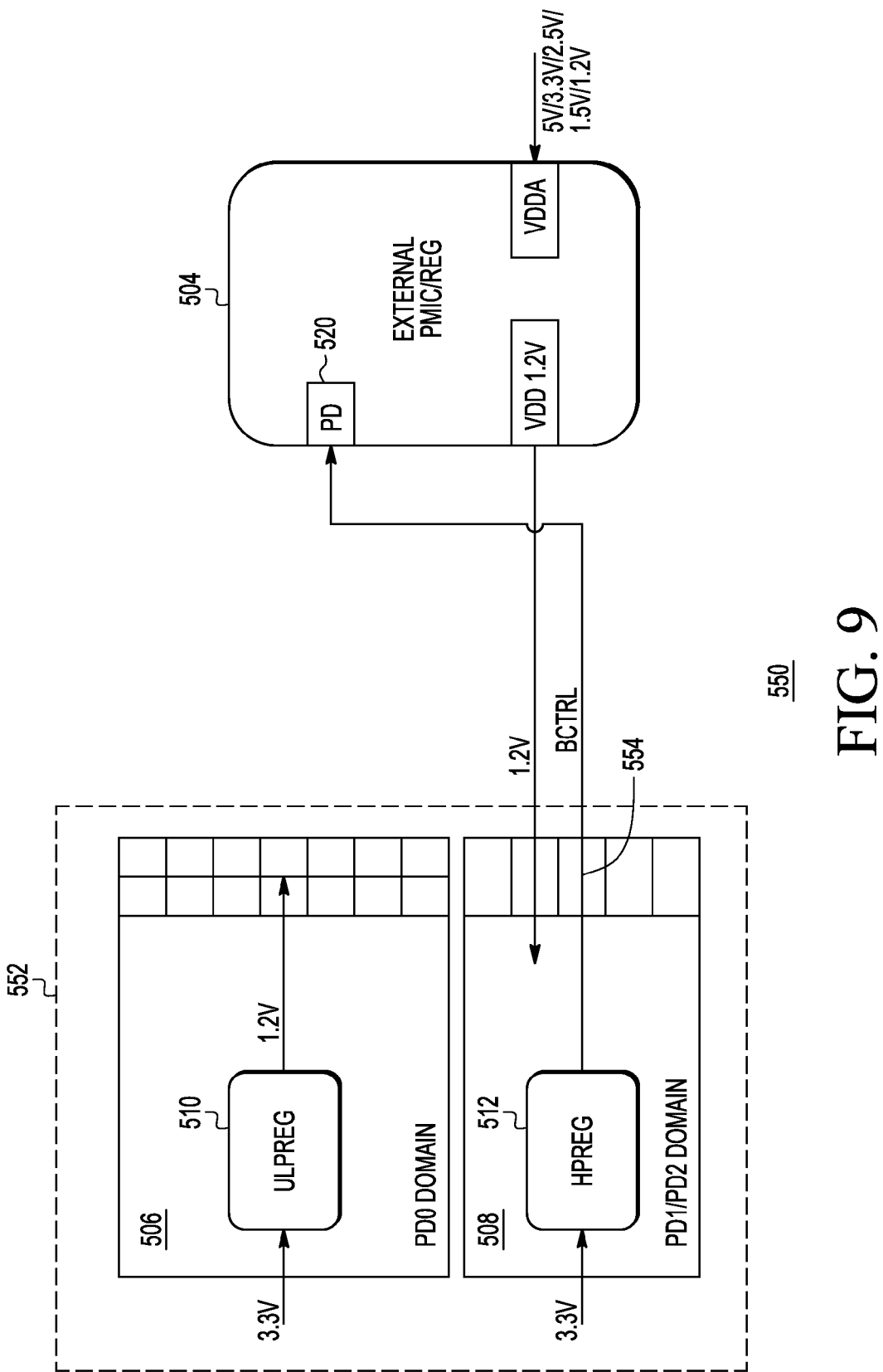
FIG. 9 is a schematic block diagram of a low power integrated circuit that supports internal and external voltage regulators in accordance with yet another embodiment of the present invention.

FIG. 9 is a schematic block diagram of a system 500 comprising an integrated circuit 502 such as a SoC, connected to an external power management integrated circuit (PMIC)/Regulator 504. In the example shown, the SoC 502 has its core logic digital and analog circuits partitioned into two or more power domains, such as a PD0 domain 506 and a PD1/PD2 domain 508. The PD0 domain 506 comprises first digital and analog circuit partitions powered by an ultra-low power regulator (ULPREG) 510, while the PD1/PD2 domain 508 comprises a second digital and analog circuit partitions powered by a second power supply such as a high power regulator (HPREG) 512.

To enable and disable the internal regulators 510, 512 and the external PMIC/REG 504 used to supply power to the power domains 506, 508, the SoC 502 contains a regulator selection circuit, such as the regulator selection circuit 200 (FIG. 2) that provides power ON/OFF signals between the regulators 504, 510, 512. In FIG. 6, the SoC 502 has a POR pin 514 that receives an external power on reset signal (POR_EXT) and provides a power ON/OFF indicator output signal 516 on a power ON/OFF indicator pad 518 located in the PD0 power domain 506. During a Power Up event, the ULPREG 510 turns ON and the power ON/OFF indicator pad 518 drives a logic low state "0" to a PD pin 520 of the external PMIC/REG 504 to turn it ON. During a Low Power Entry event, the power ON/OFF indicator pad 518 is driven to a logic high state "1" to turn off the external PMIC/REG 504. During a Low Power Exit (Wake up) event, the power ON/OFF indicator pad 518 drives a logic "0" to turn on the external PMIC/REG 504. The power ON/OFF indicator pad 518 can be implemented using a GPIO (General Purpose IO) pad or a GPO or a reset pad in this embodiment to control power up and power down of the external PMIC/REG 504. In one embodiment the logic state of the GPIO pad can be kept opposite as mentioned above,—power down (PD) input of the PMIC/REG 504 is an active low signal. The external PMIC/REG 504 sends the power on reset signal (POR_EXT) to the SoC 502 indicating that the external PMIC/REG 504 is fully powered up.

The POR_EXT signal may be qualified by a first supply indicator signal (OK_1P2) of a 1.2V supply and a second supply indicator signal (OK_3P3) of a 3.3V supply; a logic AND gate 522 receives the OK_1P2 and OK_3P3 signals and generates the POR_EXT signal. Although the AND gate 522 is shown outside of the PMI/REG 504, that is for clarity, and in a preferred embodiment, the AND gate 522 is located within the PMIC/REG 504. Further, the AND gate 522 is required only if the PMIC selection logic has a power sequence dependency between the 1.2V and 3.3V supplies. Otherwise, the POR_EXT signal can be generated directly instead of via the AND gate 522. The OK_3P3 and OK_1P2 signals are indicators that a 3.3V PMC supply and a 1.2V supply are available. This can be a LVD (low voltage detection) signal on either the 3.3V supply or the 1.2V supply. Alternatively, the OK_3P3 and OK_1P2 signals can be generated within the SOC 502 to monitor the 3.3V supply and the 1.2V supply. If, for example, the OK_1P2 signal is not available, then the POR_EXT signal can be tied to the 3.3V supply so that the POR_INT signal will continue to monitor the 1.2V supply. Recall that the POR_CTRL signal (FIGS. 2, 3, 4) is generated is ANDing the POR_EXT and POR_INT signals.

Figure 7:
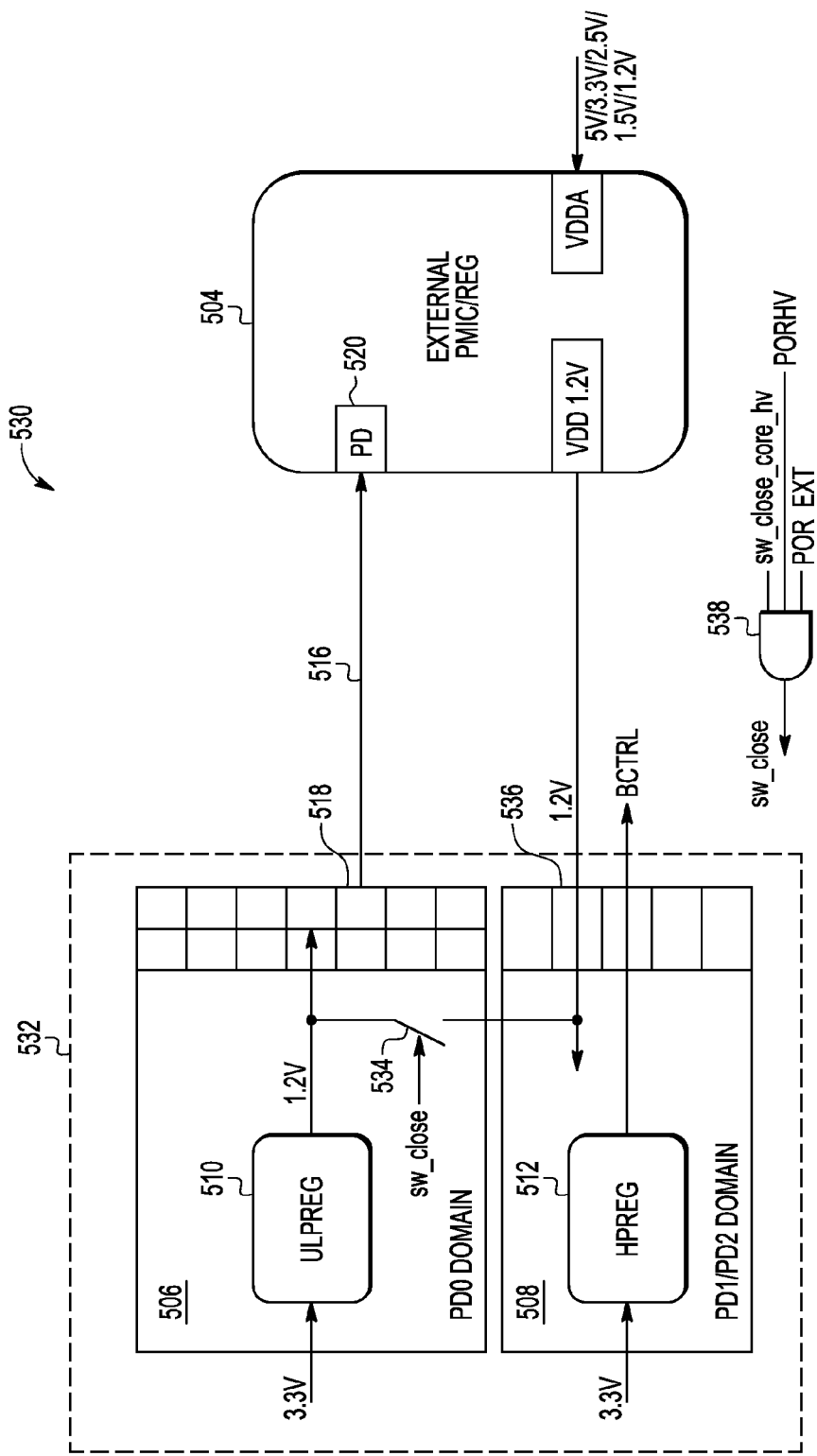
FIG. 7 is a schematic block diagram of a low power integrated circuit that supports internal and external voltage regulators in accordance with another embodiment of the present invention.

FIG. 7 schematically illustrates a system 530 including an integrated circuit (SOC) 532 connected to the external PMIC/REG 504 according to a another embodiment of the invention. The SOC 532 is similar to the SOC 502 of FIG. 6, in that it comprises the GPIO pad 518 in the power domain PD0 506 as the power ON/OFF indicator signal and a POR_EXT signal from the external PMIC/REG 504, but differs in that it comprises a power switch 534 to supply power for the first digital core logic circuit partition PD0 506 from the external PMIC/REG 504, where the first internal voltage regulator ULPREG 510 can be turned OFF after the external PMIC/REG 504 is turned ON. For low power operation or for test/debug purposes, it is desirable to be able to turn OFF at least one of the ULPREG 510 and HPREG 512 when the external PMIC/REG 504 is used to provide power for the SOC 532. In one embodiment, the power switch 534 is controlled by the POR_EXT signal from the external PMIC/REG 504, a PORHV signal and a sw_close_core_hv signal generated by a state machine logic in the SOC 502, and as shown using a 3 input AND gate 538. The PORHV signal is an internal signal that monitors the 1.2V and 3.3V supplies. For example, when both the 1.2V and 3.3V supplies reach above their respective LVD level, the PORHV signal goes high, which can be an output of the PMIC/REG 504. The POR_EXT signal comes from the external regulator, which indicates that the 1.2V generated by the external regulator 504 is stable. In internal regulation mode, the POR_EXT signal needs to be tied externally to the 3.3V supply of the PMIC/REG 504. The sw_close_core_hv signal is controlled by the state machine. This signal is de-asserted/asserted by the state machine for low power mode entry/exit. During a Power Up event, the ULPREG 510 is initially enabled and the power switch 534 is open (isolated). When the POR_EXT signal goes high, the power switch 534 is closed (shorted) and the ULPREG 510 is turned off. During a Low Power Entry event, the ULPREG 510 is turned ON by the state machine logic and the power switch 534 is opened, and the GPIO pad 518 is set to a logic high state to turn off the external PMIC/REG 504. During a Low Power Exit event, the power ON/OFF indicator pad 518 drives a logic "0" to turn on the external PMIC/REG 504, and the POR_EXT signal goes high then the state machine logic closes the power switch 534 and turns OFF the ULPREG 510.

Figure 8:
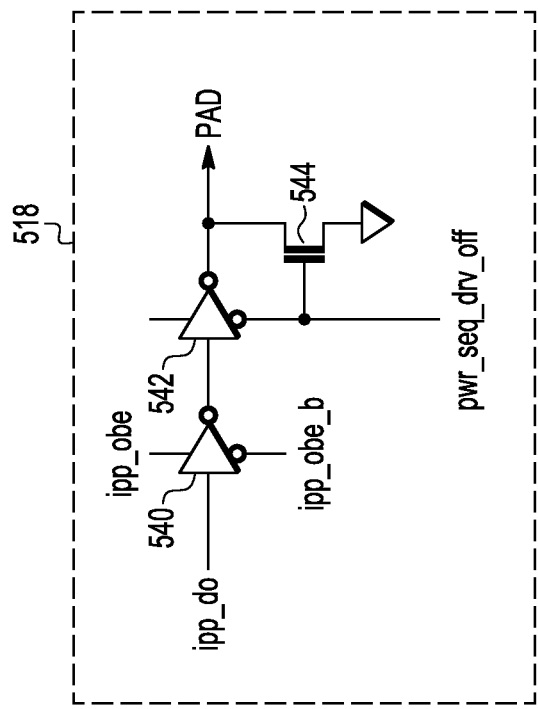
FIG. 8 is a schematic block diagram of a low power integrated circuit that supports internal and external voltage regulators in accordance with yet another embodiment of the present invention.

FIG. 8 is a schematic circuit diagram of the GPIO pad 518 (FIGS. 6-7), which is located in the power domain PD0 506 and used for the power ON/OFF indicator signal 516. The GPIO pad 518 has a start-low structure, meaning it will drive a logic low state "0" to turn ON the external PMIC/REG 504 when the first internal voltage regulator ULPREG 510 is kept OFF during a power-up sequence. In contrast, a conventional GPIO pad will present a high impedance state (high Z) when the power supply of the pad is not available. It is desirable to be able to turn on the external PMIC/REG 504 even if the at least one of the internal regulators 510, 512 cannot be powered up during a power up sequence. Using the start-low GPIO pad circuit 518, the ULPREG 510 can be kept OFF by default with the power switch 534 closed during the power up sequence.

More particularly, the GPIO pad 518 comprises first and second series connected tri-state inverters 540, 542, and a switch 544, where the switch 544 has a drain connected to an output of the second tri-state inverter 542, a source connected to ground, and a gate connected to the inverting side control input of the second tri-state inverter 542. The start-low GPIO pad 518 drives a logic "0" (on the line labeled "pad") when either a low or high voltage supply of this IO pad is not available, and so a default (reset) configuration is kept such that during power up, this pad drives "0". Alternatively, a general GPIO cell can be modified to have a POR and reset value of logic "0". When either of a low or high voltage supply of the pad is not available, the pad will drive a logic "0" state. During a low power mode entry, the GPIO pad 518 is configured by a state machine to drive a logic "1" so that the external regulator 504 can be powered down. During a Low Power mode exit, when a wake-up signal is received, the pad 518 is caused to drive a logic low "0" by the state machine so that the external regulator 504 is powered up and provides the 1.2V supply for the OFF domain (PD1/PD2) domain 508. In one example, in a Low Power mode the PD0 domain 506 supply is kept ON. In one embodiment, a power sequence signal "pwr_seq_drv_off" generated by the SOC 532 is coupled to the GPIO pad 518 to indicate that a low or high voltage supply of the pad is not available. This indicator signal goes high when a 1.2V or 3.3V IO supply is not available, thereby forcing the GPIO pad 518 to ground. Once a 1.2V supply for this pad (inside the PD0 domain 506) is available, the pwr_seq_drv_off signals goes low, and a data input "ipp_do" signal can then drive the GPIO pad 518. A default (reset) state for "ipp_do" signal will be "0" and a control input "ipp_obe" will be kept "1" so that the GPIO pad 518 drives zero from the beginning of a power-up sequence. With this circuit arrangement, the GPIO pad 518 is always driven low ("0") during power up so that the external regulator PD signal is always de-asserted to "0" so that the external regulator 504 is powered up. In a low power mode, the ipp_do signal is driven to "1" so that the external regulator PD signal is asserted, which places the external regulator into power down mode. In one embodiment, the "pwr_seq_drv_off", "ipp_do" and "ipp_obe" signals are provided from the PD0 domain 506 and are driven by a state machine that places the SOC 532 in a low power mode.

Referring now to FIG. 9, a schematic block diagram of a system 550 including the external regulator 504 and a SOC 552 is shown. The SOC 552 is similar to the SOC 502 (FIG. 6) in that it includes the PD0 domain 506 and PD1/PD2 domain 508 and those domains 506, 508 include the regulators 510 and 512, respectively. The SOC 552 provides a power ON/OFF indicator signal from a BCTRL pad 554 of the power domain PD1/PD2 508 powered by the HPREG 512, instead of from the power domain PD0 506 which is powered by the ULPREG 510. In a conventional design, the BCTRL pad is used to drive an external ballast (e.g., a bipolar transistor) for an internal voltage regulator and, in the conventional design, the BCTRL pad is unused when an external voltage regulator is used. In the embodiment of FIG. 9, using the BCTRL pad 554 for power down control of the external regulator 504 in external regulation mode saves a GPIO pad and keeps a low or minimum number of pin count for internal/external voltage regulator related operations.

Figure 10:
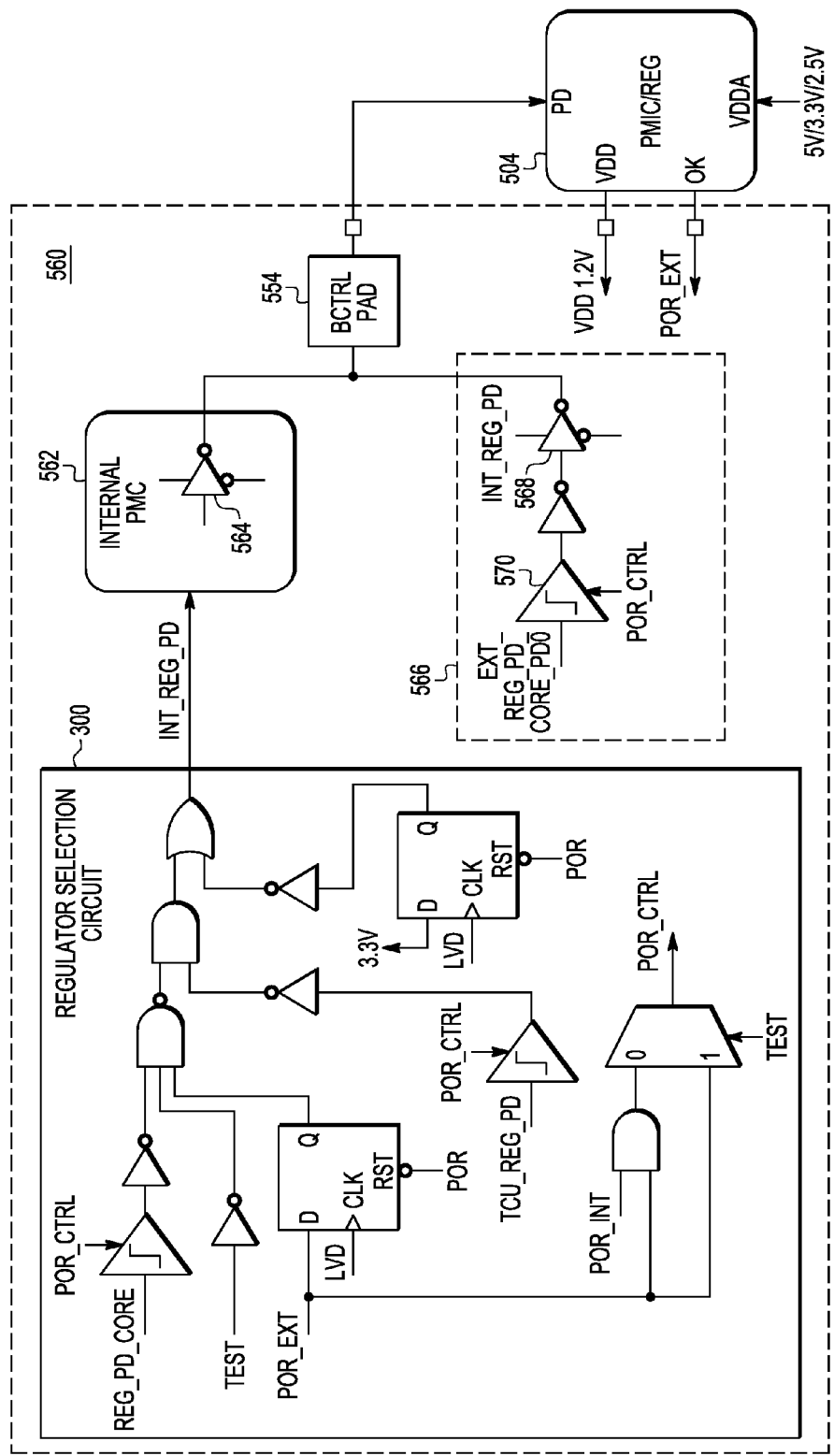
FIG. 10 is a schematic block diagram of an embodiment of a pad cell of the integrated circuit of FIG. 9.

FIG. 10 is a schematic block diagram of another embodiment of a SOC 560 having multiple power domains and internal regulators (not shown) and also connected to an external regulator 504 by way of the BCTRL pad 554 (FIG. 9). The SOC 560 also includes the regulator selection circuit 300 previously described with respect to FIG. 3 for generating the decoded regulator selection signal, INT_REG_PD. In this embodiment, the SOC 560 has an internal power management controller (PMC) 562 that receives the INT_REG_PD signal. The BCTRL pad 554 is driven by a tri-state buffer 562 within the internal PMC 562 and a tri-state buffer circuit 566. The tri-state buffer circuit 566 has a tri-state buffer 568 that receives an input from a level shifter 570 that level shifts an EXT_REG_CORE_PD0 signal, which in one embodiment, is generated by a state machine in order to drive the BCTRL pad 554 (in external mode) to turn ON/OFF the external regulator 504. For example, in one embodiment, for the BCTRL pad 554 to work properly to control the external PMIC/REG 504, the internal PMC 562 is turned OFF by the INT_REG_PD signal (i.e., none of the signals input to the regulator selection circuit 300 is toggled).

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated examples may be implemented as circuitry located on a single integrated circuit or within a same device. For example, the various units described herein may be implemented within a single integrated circuit. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. An integrated circuit, comprising:
    an internal voltage regulator for generating an internal voltage;
    a digital core logic circuit that receives power from one of the internal voltage regulator and an external voltage regulator located outside of the integrated circuit;
    a power on reset (POR) pin;
    a test pin; and
    a regulator selection circuit that receives an external power on reset (POR_EXT) signal from the POR pin and a TEST signal from the test pin and decodes the POR_EXT signal and the TEST signal to select one of the internal voltage regulator and the external voltage regulator to supply power to the digital core logic circuit,
    wherein the integrated circuit is operable in:
        (i) a first functional mode in which the integrated circuit uses the internal voltage supplied by the internal voltage regulator;
        (ii) a second functional mode in which the integrated circuits uses an external voltage supplied by the external voltage regulator; and
        (iii) a test mode in which the integrated circuits uses power supplied from one of the external voltage regulator and a test equipment voltage source.

2. The integrated circuit of claim 1, wherein an external ballast is coupled to the internal voltage regulator for managing power provided to the integrated circuit in the first functional mode.

3. The integrated circuit of claim 1, wherein:
    the first functional mode provides a first power up sequence controlled by an internal power-on-reset (POR_INT) signal;
    the second functional mode provides a second power up sequence controlled by the POR_INT signal and the POR_EXT signal; and
    the test mode provides a third power up sequence controlled by the POR_EXT signal,
    wherein one of the first, second and third power up sequences is used to select one of the internal voltage regulator and the external voltage regulator to supply power to the digital core logic circuit.

4. The integrated circuit of claim 3, wherein the regulator selection circuit further comprises:
    a first logic gate that receives the POR_INT and POR_EXT signals;
    a selector having a first data input connected to an output of the first logic gate, a second data input that receives the POR_EXT signal, and a select input that receives the TEST signal, wherein the selector outputs a power on reset control (POR_CTRL) signal;
    a first latch circuit having a data input tied to a first power supply voltage, a clock input that receives a low voltage detection signal of the first power supply voltage (LVD) and a reset input that receives a power on indicator signal (POR);
    a second logic gate having a first data input, a second data input coupled to an output (Q) of the first latch circuit, and an output that provides a regulator power down (REG_PD) signal;
    a first level shifter having a data input that receives a test control unit regulator power down (TCU_REG_PD) signal and a control input that receives the POR_CTRL signal from the selector;
    a third logic gate having a first data input, a second data input coupled to an output of the first level shifter, and an output coupled to the first data input of the second logic gate;
    a fourth logic gate having first and second data inputs, and an output coupled to the first data input of the third logic gate;
    a second level shifter having a data input, a control input that receives the POR_CTRL signal, and an output connected to the first data input of the fourth logic gate;
    a fifth logic gate having an output coupled to the second data input of the fourth logic gate, a first data input that receives the POR_EXT signal, and a second data input that receives the TEST signal; and
    a sixth logic gate having an output coupled to the data input of the second level shifter, a first data input that receives a Fuse/Flash power down (PD) bit signal, and a second data input that receives an internal regulator power down (REG_PD_CORE) signal,
    wherein the first and second level shifters are reset by the POR_CTRL signal when one of the POR_INT and POR_EXT signals is at a logic low state, and
    wherein the POR_CTRL signal and the internal regulator power down (REG_PD_CORE) signal are used to select the one of the internal voltage regulator and the external voltage regulator for the first, second and third power up sequences.

5. The integrated circuit of claim 3, wherein the regulator selection circuit further comprises:
    a first logic gate that receives the POR_INT signal and the POR_EXT signal;
    a selector having a first data input connected to an output of the first logic gate, a second data input that receives the POR_EXT signal, and a select input that receives the TEST signal, wherein the selector outputs a POR_CTRL signal;

a first latch circuit having a data input tied to a first power supply voltage, a clock input that receives a low voltage detection (LVD) signal of the first power supply voltage and a reset input that receives a power on reset signal (POR);

a second logic gate having a first data input, a second data input coupled to an output (Q) of the first latch circuit, and an output that provides an internal regulator power down (REG_PD) signal;

a first level shifter having a data input that receives a test control unit regulator power down (TCU_REG_PD) signal and a control input that receives the POR_CTRL signal from the selector;

a third logic gate having a first data input, a second data input coupled to an output of the first level shifter, and an output coupled to the first data input of the second logic gate;

a second latch circuit having a data input that receives the POR_EXT signal, a clock input that receives the LVD signal, and a reset input that receives the POR signal;

a second level shifter having a data input that receives an internal regulator power down (REG_PD_CORE) signal and a control input that receives the POR_CTRL signal from the selector; and a fourth logic gate having a first data input coupled to an output of the second level shifter, a second data input coupled to the test pin for receiving the TEST signal, a third data input that receives the output (Q) of the second latch circuit, and an output coupled to the first data input of the third logic gate, wherein the output (Q) of the second latch circuit turns the internal voltage regulator OFF in the second functional mode after a low-to-high transition on the POR_EXT signal, and wherein the POR_CTRL and REG_PD signals are used to select the one of the internal voltage regulator and the external voltage regulator for the first, second and third power up sequences.

6. The integrated circuit of claim 3, wherein the regulator selection circuit further comprises:

a first logic gate having a first input that receives an external regulator (EXT_REG) signal, a second input that receives the POR_EXT signal, and an output;

a second logic gate having a first input that receives the POR_INT signal, a second input coupled to the output of the first logic gate, and an output;

a selector having a first data input connected to the output of the second logic gate, a second data input that receives the POR_EXT signal, a select input that receives the TEST signal, and an output that provides a POR_CTRL signal;

a first latch circuit having a data input tied to a first power supply voltage (3.3V), a clock input receiving a low voltage detection (LVD) signal of the first power supply voltage and a reset input receiving a power on reset signal (POR);

a third logic gate having a first data input, a second data input coupled to an output (Q) of the first latch circuit, and an output that provides a regulator power down (REG_PD) signal;

a first level shifter having a data input that receives a test control unit regulator power down (TCU_REG_PD) signal and a control input that receives the POR_CTRL signal;

a fourth logic gate having a first data input, a second data input coupled to an output of the first level shifter, and an output coupled to the first data input of the third logic gate;

a second level shifter having a data input that receives an internal regulator power down (REG_PD_CORE) signal and a control input that receives the POR_CTRL signal;

a second latch circuit having a data input tied to the first power supply voltage (3.3V), a clock input that receives the POR_EXT signal, and a reset input that receives the power on reset signal (POR); and a fifth logic gate having a first data input coupled to an output of the second level shifter, a second data input that receives the TEST signal, a third data input coupled to an output (Q) of the second latch circuit for receiving an external regulation signal (EXT_REG), and an output coupled to the first data input of the fourth logic gate, wherein the POR_CTRL signal and the REG_PD signal are used to select the one of the internal voltage regulator and the external voltage regulator in one of the three power up sequences.

7. The integrated circuit of claim 6, wherein the second latch circuit has a master stage and a slave stage, and the slave stage is reset to a logic state opposite to a logic state of the master stage, wherein the second latch circuit further comprises:

a first inverter;

a first tri-state inverter having an input coupled to an output of the first inverter, an output coupled to a data input of the first inverter, and a control input that receives the POR_EXT signal;

a second tri-state inverter having an output coupled to the input of the first inverter, an input tied to the first power supply voltage (3.3V), and a control input that receives the POR_EXT signal;

a first transistor having a first current electrode tied to the first power supply voltage, a second current electrode coupled to the output of the first inverter, and a control electrode that receives the POR signal (POR);

a third tri-state inverter having a data input coupled to the output of the first inverter, a first control input that receives an inverted version of the POR_EXT signal (POR_EXTB), and a second control input;

a second transistor having a first current electrode coupled to the second control input of the third tri-state inverter, a second current electrode, and a control electrode that receives the POR_EXT signal;

a third transistor having a first current electrode coupled to the second current electrode of the second transistor, a second current electrode tied to ground, and a control electrode that receives the power on reset signal (POR);

a second inverter having an input coupled to an output of the third tri-state inverter;

a fourth tri-state inverter having an input coupled to an output of the second inverter, and an output coupled to the input of the second inverter, wherein the output of the second inverter provides the external regulation signal (EXT_REG); and a fourth transistor having a first current electrode tied to the first power supply voltage, a second current electrode coupled to the output of the third tri-state inverter, and a control electrode that receives the power on reset signal (POR), and wherein the external regulation signal (EXT_REG) is used to enable the internal voltage regulator in one of the three power up sequences.

8. An integrated circuit, comprising:
a first internal voltage regulator for generating a first internal voltage;
a second internal voltage regulator for generating a second internal voltage;
a first digital core logic circuit partition that receives power from one of the first and second internal voltage regulators and from an external voltage regulator located outside of the integrated circuit;
a second digital core logic circuit partition that receives power from one of the first and second internal voltage regulators and the external voltage regulator;
a power on reset (POR) pin;
a power ON/OFF indicator pin connected to a power down pin of the external voltage regulator for turning the external voltage regulator on and off;
a power switch connected between the first internal voltage regulator and the external voltage regulator, wherein when the power switch is closed, the first digital core logic circuit partition receives power from the external voltage regulator, and when the power switch is open, the first digital core logic partition receives power from the first internal voltage regulator; and
a regulator selection circuit that receives an external power on reset signal (POR_EXT) from the POR pin, and provides a power ON/OFF indicator signal to the power ON/OFF indicator pin, wherein the first internal voltage regulator is turned off after the external voltage regulator is turned on.

9. The integrated circuit in claim 8, wherein the first internal voltage regulator is a low power voltage regulator (ULPREG) that provides the first internal voltage to the first digital core logic circuit partition, and the second internal voltage regulator is a high performance voltage regulator (HPREG) that provides the second internal voltage to the second digital core logic circuit partition.

10. The integrated circuit of claim 8, further comprising:
a first logic gate that has a first data input that receives a first supply indicator signal (OK_1P2) and a second data input that receives a second supply indicator signal (OK_3P3), and an output that provides an external power on reset signal (POR_EXT), wherein the output of the first logic gate is coupled to the POR pin.

11. The integrated circuit of claim 8, wherein the power switch has a first electrode connected to the first digital core logic circuit partition, a second electrode connected to the second digital core logic circuit partition, and a control electrode that receives a switch close signal, and wherein the integrated circuit further comprises:
a first power pad that receives a third power supply voltage (1.2V) from the external voltage regulator for providing power to the first and second digital core logic circuit partitions; and
a logic gate having an output that provides the switch close signal to the control electrode of the power switch, a first data input coupled to a core logic switch control signal (sw_close_core_hv), a second data input coupled to a power-on-reset signal (PORHV) generated by a state machine logic in the integrated circuit, and a third data input that receives the external power-on-reset signal (POR_EXT), and
wherein the power switch is open during power up when the first internal voltage regulator is enabled, and the power switch is closed after the external voltage regulator is powered up and providing the third power supply voltage (1.2v) to both the first and second digital core logic circuit partitions.

12. The integrated circuit of claim 8, wherein a GPIO pad is located in the first digital core logic circuit partition and is coupled to a power down input (PD) of the external voltage regulator to power-up and power-down the external voltage regulator.

13. The integrated circuit of claim 12, further comprising:
a first logic gate having an output coupled to the power ON/OFF indicator pin, a first data input, and a first control input that receives a power sequence signal (pwr_seq_drv_off) generated by one of the first digital core logic circuit partition and the second digital core logic circuit partition and coupled to the GPIO pad;
a second logic gate having an output coupled to the first data input of the first logic gate, a first data input that receives a core logic control signal (ipp_do) from one of the first digital core logic circuit partition and the second digital core logic circuit partition, and a first control input that receives a power sequence signal (ipp_obe) from one of the first digital core logic circuit partition and the second digital core logic circuit partition; and
a first transistor having a first current electrode coupled to the output of the first logic gate, a second current electrode coupled to ground, and a control electrode coupled to the first control input of the first logic gate.

14. The integrated circuit of claim 8, wherein the first internal voltage regulator is kept off during a power-up sequence.

15. The integrated circuit of claim 8, further comprising:
a power management controller (PMC) having an output pin coupled to the power ON/OFF indicator pin for providing the power ON/OFF indicator signal to the external voltage regulator,
wherein the PMC is turned off by the regulator selection circuit when the external voltage regulator is on and is used to provide power to the integrated circuit.

16. The integrated circuit of claim 15, further comprising:
a first tri-state driver having an output coupled to the PMC output pin, a first data input that receives a signal from the PMC, and a control input that receives an internal regulator power down signal (INT_REG_PD) from the regulator selection circuit;
a second tri-state driver having an output coupled to the PMC output pin, a first data input, and a control input that receives the INT_REG_PD signal from the regulator selection circuit; and
a level shifter having an output coupled to the first data input of the second tri-state driver, a first data input that receives an EXT_REG_PD_CORE_PD0 signal from one of the first digital core logic circuit partition and the second digital core logic circuit partition, and a first control input that receives a POR_CTRL signal from the regulator selection circuit,
wherein the POR_CTRL signal resets the output of the level shifter to a logic value of "0" to provide a logic low state on the power down input PD of the external voltage regulator during power-up.

17. A method of operating an integrated circuit including a digital core logic circuit powered by one of an internal voltage regulator and an external voltage regulator located outside of the integrated circuit, the method comprising:
receiving a power on reset (POR) signal on a POR pin and a test signal on a test pin;
decoding the POR signal and the test signal to generate a voltage regulator selection signal;
disabling one of the internal and external voltage regulators based on the voltage regulator selection signal;

enabling the internal voltage regulator when the voltage regulator selection signal indicates an internal regulator mode;

enabling the external regulator when the voltage regulator selection signal indicates an external regulator mode;

turning on the external voltage regulator during one of a power-up sequence and a wake-up event using a power indicator signal;

turning off the external voltage regulator, using the power indicator signal, upon entering a low power mode;

delivering power generated by the external voltage regulator to the digital core logic circuit when the power indicator signal is in a first state; and disabling the internal voltage regulator when the external voltage regulator is turned on.

18. The integrated circuit of claim 17, further comprising:
coupling a first digital core logic circuit partition (PD0) to a second digital core logic circuit partition (PD1/PD2) by way of a power switch, wherein the first digital core logic circuit partition (PD0) and the second digital core logic circuit partition are powered by the internal regulator in the internal regulator mode;

delivering power from the external voltage regulator to the first digital core logic circuit partition (PD0) and the second digital core logic circuit partition (PD1/PD2) by way of the power switch in the external regulator mode; and disconnecting the internal regulator from one of the first and second digital core logic circuit partitions in the external regulator mode, and wherein the power switch is controlled by the POR signal.

19. The integrated circuit of claim 18, further comprising:
resetting the power indicator pin to the first logic state during power-up to turn on the external voltage regulator;

providing power from the external voltage regulator to the digital core logic circuit during power-up;

enabling the internal voltage regulator upon receiving a low power mode signal; and setting the power indicator pin to a second logic state opposite the first logic state to turn OFF the external voltage regulator.

* * * * *